US012755931B2

(12) United States Patent
Shon

(10) Patent No.: US 12,755,931 B2
(45) Date of Patent: Oct. 6, 2026

(54) E-BEAM EXPOSURE METHOD AND MASK MANUFACTURING METHOD COMPRISING THE SAME

(71) Applicant: Samsung Electronics Co., Ltd., Suwon-si (KR)

(72) Inventor: Jungwook Shon, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 306 days.

(21) Appl. No.: 18/667,209

(22) Filed: May 17, 2024

(65) Prior Publication Data

US 2025/0157789 A1 May 15, 2025

(30) Foreign Application Priority Data

Nov. 13, 2023 (KR) ........................ 10-2023-0156702

(51) Int. Cl.

*H01J 37/317* (2006.01)
*H01J 37/244* (2006.01)
*H01J 37/304* (2006.01)

(52) U.S. Cl.

CPC ........ *H01J 37/3177* (2013.01); *H01J 37/244* (2013.01); *H01J 37/304* (2013.01); *H01J 2237/0451* (2013.01); *H01J 2237/24564* (2013.01)

(58) Field of Classification Search

CPC ........ H01J 37/09; H01J 37/045; H01J 37/244; H01J 37/304; H01J 37/3177; H01J 2237/0451; H01J 2237/24564

See application file for complete search history.

(56) References Cited

U.S. PATENT DOCUMENTS

| | | | | |
|---|---|---|---|---|
| 6,137,113 | A | 10/2000 | Muraki | |
| 8,057,972 | B2 | 11/2011 | Fragner et al. | |
| 9,159,555 | B2 | 10/2015 | Matsumoto | |
| 10,325,756 | B2 | 6/2019 | Platzgummer | |
| 2016/0211114 | A1* | 7/2016 | Iwata | H01J 37/3177 |
| 2020/0258716 | A1* | 8/2020 | Matsumoto | H01J 37/3177 |
| 2020/0312619 | A1* | 10/2020 | Mangnus | H01J 37/28 |
| 2020/0335297 | A1* | 10/2020 | Kishi | H01J 37/045 |

FOREIGN PATENT DOCUMENTS

| | | | |
|---|---|---|---|
| JP | 3419913 | B2 | 6/2003 |
| JP | 3787417 | B2 | 6/2006 |
| JP | 2006 210455 | A | 8/2006 |
| JP | 5956797 | B2 | 7/2016 |
| JP | 7064831 | B2 | 5/2022 |
| JP | 7094112 | B2 | 7/2022 |

* cited by examiner

*Primary Examiner* — David E Smith

(74) *Attorney, Agent, or Firm* — Harness, Dickey & Pierce, P.L.C.

(57) ABSTRACT

An E-beam exposure method may include receiving exposure information on a pattern subject to exposure, determining on beams and off beams of an E-beam exposure apparatus, determining an exposure time in an exposure process, performing the exposure process using the E-beam exposure apparatus, measuring a current of the off beams on an aperture plate of the E-beam exposure apparatus, and a first determination of determining whether the current is within a reference range. If the current is not within the reference range in the first determination, the determining the exposure time may be performed and the exposure time may be changed.

20 Claims, 9 Drawing Sheets

E-BEAM EXPOSURE METHOD AND MASK MANUFACTURING METHOD COMPRISING THE SAME

CROSS-REFERENCE TO RELATED APPLICATION

This application is based on and claims priority under 35 U.S.C. § 119 to Korean Patent Application No. 10-2023-0156702, filed on Nov. 13, 2023 in the Korean Intellectual Property Office, the disclosure of which is incorporated by reference herein in its entirety.

BACKGROUND

Inventive concepts relate to an E-beam exposure method, and more particularly, to an E-beam exposure method using multi-beams.

Generally, an E-beam exposure process may be performed to form a pattern on a photomask or an EUV mask. A processing device that uses multi-beams in the E-beam exposure process is referred to as a multi-beam writer (MBW), and in particular, the MBW used in mask manufacturing is referred to as a multi-beam mask writer (MBMW). Recently, MBMWs, which perform patterning using 262,144 (512*512) programmable beamlets within a beam array field, have been used to manufacture masks.

SUMMARY

Inventive concepts provide an E-beam exposure method of measuring and correcting current fluctuations in an E-beam in real time to precisely perform an exposure process, and a mask manufacturing method including the E-beam exposure method.

In addition, aspects of inventive concepts are not limited to those mentioned above, and other aspects of inventive concepts may be clearly understood by those skilled in the art from the description below.

According to an embodiment of inventive concepts, an E-beam exposure method may include receiving exposure information on a pattern subject to exposure; determining on beams and off beams of an E-beam exposure apparatus; determining an exposure time in an exposure process; performing the exposure process using the E-beam exposure apparatus; measuring a current of the off beams on an aperture plate of the E-beam exposure apparatus; and a first determination of determining whether the current is within a reference range. In response to the current not being within the reference range in the first determination, the determining the exposure time may be performed and the exposure time may be changed.

According to an embodiment of inventive concepts, an E-beam exposure method may include receiving information on a pattern subject to exposure; determining on beams and off beams of an E-beam exposure apparatus; determining an exposure time in an exposure process; performing the exposure process using the E-beam exposure apparatus; measuring a first current of the off beams using a sensor on an aperture plate of the E-beam exposure apparatus; calculating a second current by normalizing the first current; calculating a third current by sampling the second current; a first determination of determining whether the exposure process for a set area is completed; and in response to determining the exposure process is not completed in the first determination, performing a second determination of determining whether the third current is within a reference range. In response to the third current not being within the reference range in the second determination, the determining the exposure time may be performed and the exposure time may be changed. In response to the third current being within the reference range in the second determination, the exposure process may be performed without changing the exposure time.

According to an embodiment of inventive concepts, a mask manufacturing method may include preparing a blank mask; applying an E-beam resist layer onto the blank mask; performing an E-beam exposure process on the E-beam resist layer; developing the E-beam resist layer to form an E-beam resist pattern; and etching a lower layer by using the E-beam resist pattern as an etch mask. The performing the E-beam exposure process may include receiving exposure information on a pattern subject to exposure, determining on beams and off beams of an E-beam exposure apparatus, determining an exposure time in an exposure process, performing the exposure process using the E-beam exposure apparatus, measuring a current of the off beams on an aperture plate of the E-beam exposure apparatus, and a first determination of determining whether the current is within a reference range. In response to the current not being within the reference range in the first determination, the determining the exposure time may be performed and the exposure time may be changed.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
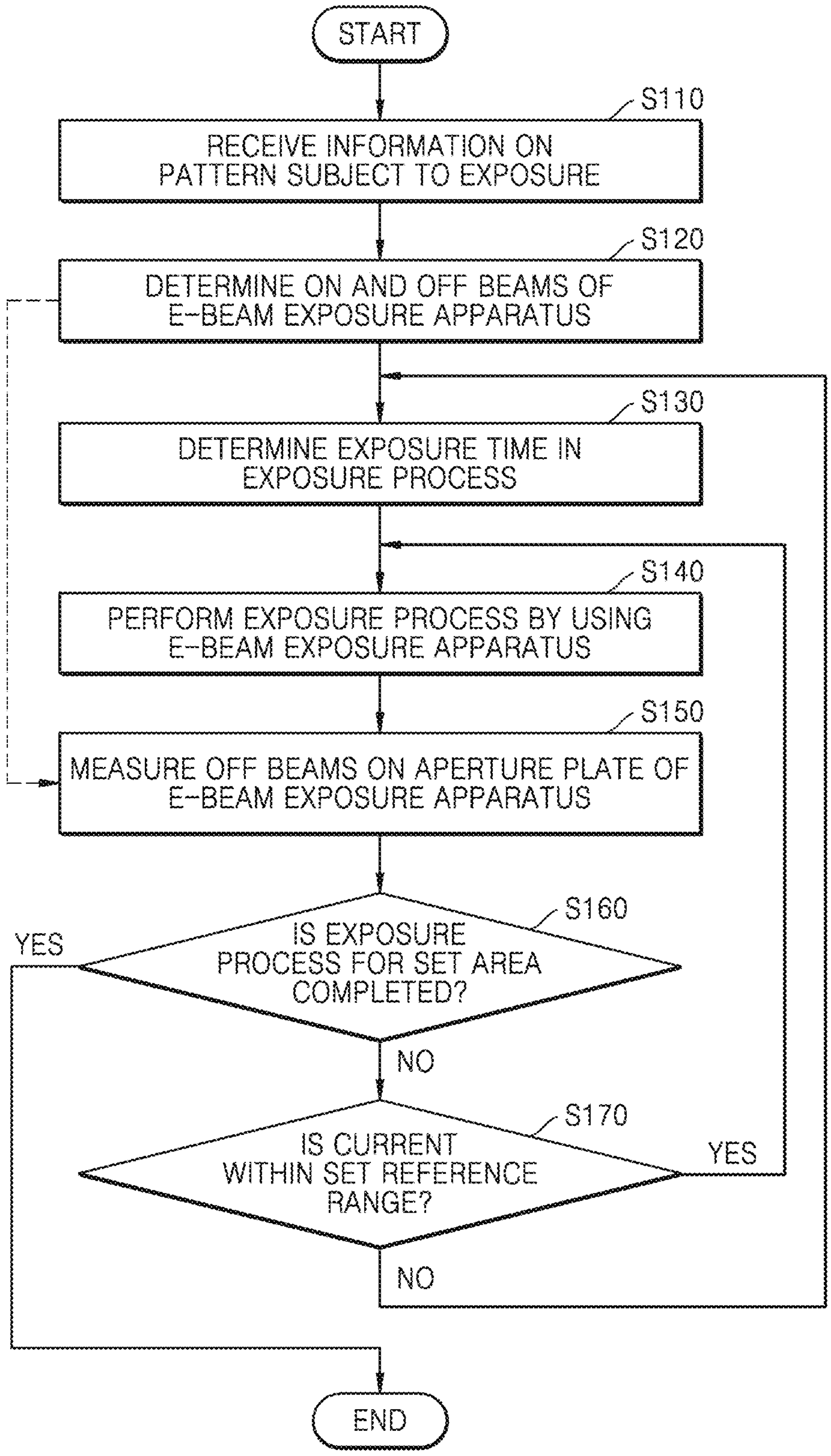
FIG. 1 is a schematic flowchart of an E-beam exposure method according to an embodiment.

Hereinafter, embodiments are described in detail with reference to the attached drawings. The same reference numerals are used for the same components in the drawings, and duplicate descriptions thereof are omitted.

Figure 2A:
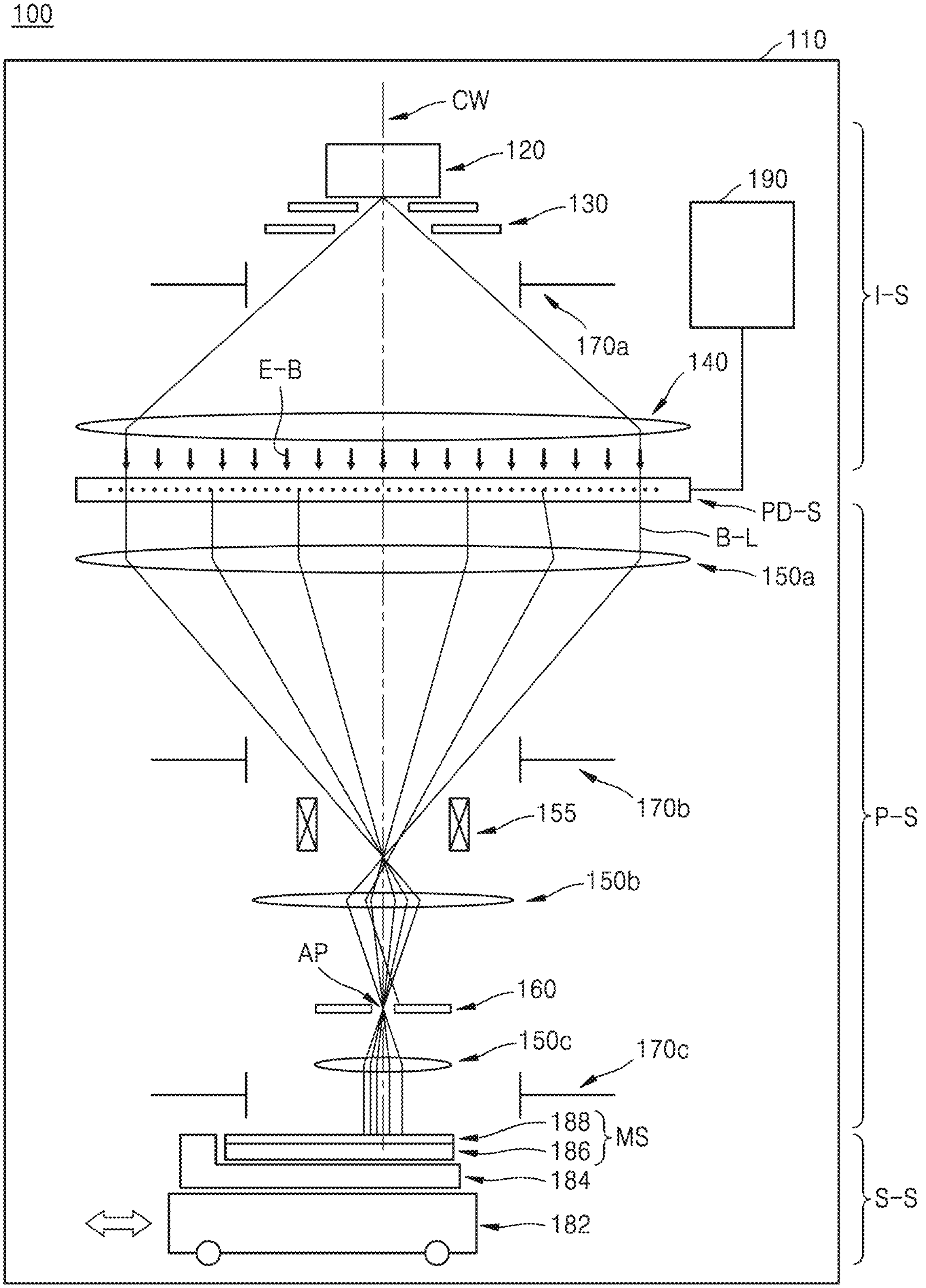
FIG. 2A is a conceptual diagram of an E-beam exposure apparatus used in the E-beam exposure method of FIG. 1.
Figure 2B:
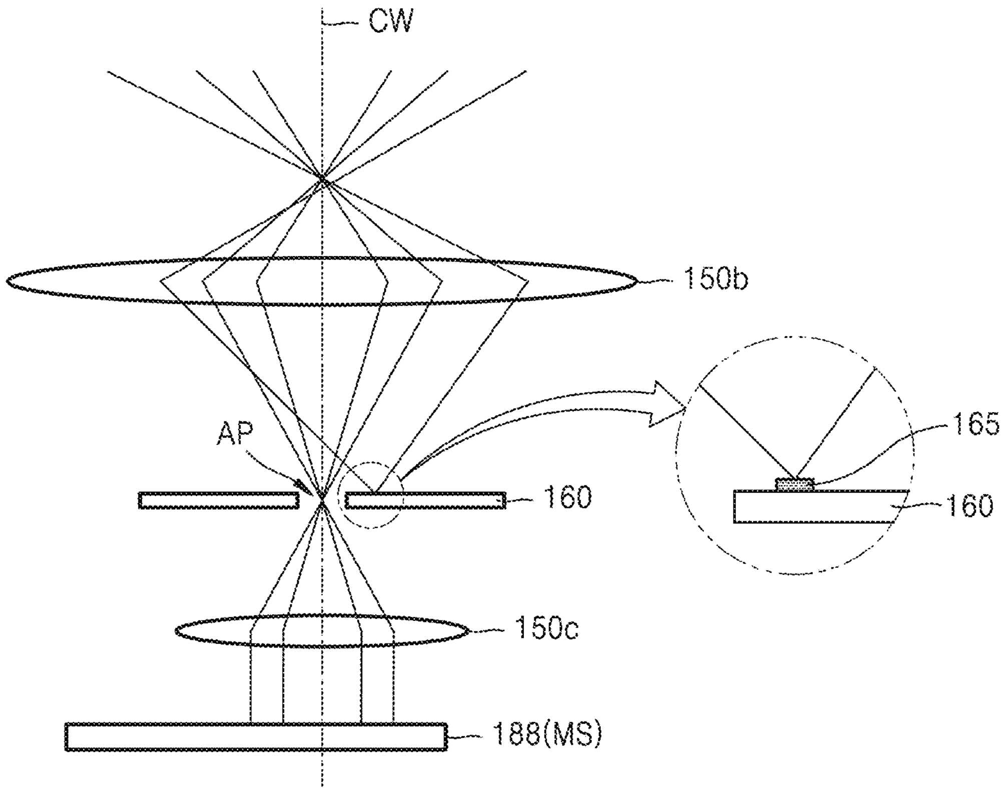
FIG. 2B is an enlarged view of an aperture plate in the E-beam exposure apparatus of FIG. 2A.

FIG. 1 is a schematic flowchart of an E-beam exposure method according to an embodiment, FIG. 2A is a conceptual diagram of an E-beam exposure apparatus used in the E-beam exposure method of FIG. 1, and FIG. 2B is an enlarged view of an aperture plate in the E-beam exposure apparatus of FIG. 2A.

Referring to FIGS. 1 to 2B, before explaining an E-beam exposure method according to an embodiment, first, an E-beam exposure apparatus 100 is briefly described. As shown in FIG. 2A, the E-beam exposure apparatus 100 may include an illumination system I-S, a pattern definition system PD-S, a projection system P-S, and a stage system S-S, which are vertically arranged from top to bottom. Each component of the E-beam exposure apparatus 100 may be placed in a vacuum housing 110 that maintains a high vacuum.

The illumination system I-S may include an electron gun 120, an extraction device 130, and a condenser lens 140. For example, the electron gun 120 may be a Schottky-type or a thermal field emission-type electron gun. However, the type of the electron gun 120 is not limited thereto. Electrons may be emitted by applying an acceleration voltage to the electron gun 120. The extraction device 130 may accelerate particles, such as electrons, to a defined energy, typically several keV, such as 5 keV. The condenser lens 140 may generate a wide and substantially telecentric (or telecentric) E-beam E-B so that electrons emitted from the electron gun 120 are used as a beam for lithography.

The E-beam E-B may then be incident on the pattern definition system PD-S. The pattern definition system PD-S may have a plate shape including a plurality of apertures. Accordingly, the pattern definition system PD-S may also be referred to as an aperture plate system (APS). For example, 262,144 (512*512) apertures may be arranged on a plate in a two-dimensional array structure. However, the number and structure of apertures of the pattern definition system PD-S are not limited thereto.

The pattern definition system PD-S may divide the incident E-beam E-B into multiple beamlets B-L using apertures. Additionally, the beamlets B-L that pass through some of the apertures may reach the target, for example, a mask MS, and the beamlets B-L that pass through the other apertures may not reach the target. Accordingly, the beamlets B-L emitted from the pattern definition system PD-S may be divided into on beams that reach the target and off beams that do not reach the target. For example, the on beams may pass through an aperture AP of an aperture plate 160 to reach the target, that is, the mask MS, and the off beams may be blocked by the aperture plate 160. That is, the off beams may fall on an upper surface of the aperture plate 160 adjacent to the aperture AP, rather than the aperture AP. The apertures of the pattern definition system PD-S are not physically open and closed, but based on the concept of open and closed, the on beams are referred to as open beams, and the off beams are referred to as closed beams. The off beams are described in detail below in operation of measuring a current of off beams (S150) and in the description of FIG. 2B.

The pattern definition system PD-S may transform (or structure) the incident E-beam E-B into a patterned beam. The pattern definition system PD-S may include a deflection element provided on the plate to divide the beamlets B-L into on beams and off beams. In other words, in the pattern definition system PD-S, the beamlets B-L may be divided into on beams and off beams by tilting the beamlets B-L through the deflection element. The deflection element may tilt the beamlets B-L through voltage. In addition, information or data on the pattern subject to exposure processed by a processing device 190 may be transmitted to the pattern definition system PD-S. The processing device 190 also may control operations of the E-beam exposure apparatus 100 discussed below.

The beamlets B-L emitted from the pattern definition system PD-S may be incident on the projection system P-S. The projection system P-S reduces the beamlets B-L so that some of the beamlets B-L may pass through the aperture AP of the aperture plate 160 and may be incident on the target, e.g., the mask MS, and the others thereof may be incident on the upper surface of the aperture plate 160.

The projection system P-S may include multiple electromagnetic-optical projector elements 150*a*, 150*b*, and 150*c*. The electromagnetic-optical projector elements 150*a*, 150*b*, and 150*c* may include, for example, electrostatic and/or magnetic lenses, and deflection elements. In addition, in the E-beam exposure apparatus 100, the illumination system I-S and the projection system P-S may include deflection elements 170*a*, 170*b*, and 170*c* for laterally deflecting the E-beam E-B with respect to an optical axis CW. The projection system P-S may include a solenoid 155 that provides an axial magnetic field.

The beamlets B-L may be reduced in the projection system P-S by forming a plurality of intersections, e.g., two intersections, through the electromagnetic-optical projector elements 150*a*, 150*b*, and 150*c*. Additionally, the beamlets B-L may form an intersection at the aperture AP of the aperture plate 160, and may pass through the aperture AP to be incident on the target, that is, the mask MS.

The stage system S-S may include a substrate stage 182, a chuck 184, and the mask MS. The mask MS may include a substrate 186 and an E-beam resist layer 188 on the substrate 186. The substrate 186 of the mask MS may be, for example, a blank mask. The blank mask may refer to a mask before a pattern is formed. The mask MS is described in more detail in the description of a mask manufacturing method in FIG. 5. The mask MS may be fixed on the chuck 184, and may be moved two-dimensionally through movement of the substrate stage 182.

The E-beam exposure apparatus 100 may be not only used to form a pattern on a mask but may also be used to form a pattern on a substrate, such as a silicon wafer. Accordingly, a wafer substrate, instead of the mask MS, may be placed on the substrate stage 182 and the chuck 184.

In the E-beam exposure method according to an embodiment, first, information on a pattern subject to exposure is received (S110). The information on the pattern may include the shape of the pattern, the dose amount for each pattern area, and the like. To form a pattern on the mask, a series of processes may be performed before the E-beam exposure process. To briefly explain the series of processes before the E-beam exposure process, a layout of the target pattern is designed, and optical proximity correction (OPC) design data is obtained through OPC to be delivered to a mask production team as mask tape-out (MTO) data. Afterwards, mask data preparation (MDP), including fracturing, augmentation, verification, etc., is performed. Additionally, in the MDP, a process of converting mask data into pixel data may be performed. The pixel data which is data directly used for actual exposure may include data on the shape of the target subject to exposure and data on the dose assigned thereto. The data on the shape thereof may be bit-map data obtained by converting shape data, which is vector data, through rasterization or the like. The information on a pattern may include shape data and dose data. Accordingly, the receiving the information on the pattern (S110) may be referred to as the rasterization.

In the E-beam exposure apparatus 100, on and off beams are determined (S120). For example, based on the received information on the pattern, on beams and off beams to be formed in the pattern definition system PD-S of the E-beam exposure apparatus 100 are determined. As described above, among the beamlets B-L emitted from the pattern definition system PD-S, the on-beams may refer to beamlets B-L that pass through the aperture AP of the aperture plate 160 and reach the mask MS, and the off beams may refer to beamlets B-L that are blocked by the aperture plate 160 and do not reach the mask MS. Additionally, the beamlets B-L may be divided into on beams and off beams by tilting the beamlets B-L through a voltage applied to the deflection element of the pattern definition system PD-S. Additionally, the determining of the on beams and the off beams may be referred to as determining open beams and closed beams, depending on an embodiment.

After determining the on beams or off beams, an exposure time in the exposure process is determined (S130). The exposure time may ultimately mean an exposure amount or a dose amount. In other words, when the exposure time is long, the dose amount for the corresponding pattern may be large, and when the exposure time is short, the dose amount for the corresponding pattern may be small.

After determining the exposure time, the exposure process is performed using the E-beam exposure apparatus 100 (S140). The exposure process may be performed in a scanning manner in one direction. Additionally, the exposure process may be performed in an overlapping manner between scan lines. For example, when exposing a next second scan line after performing exposure for a first scan line, a part of the exposure area of the first scan line may overlap with a part of the exposure area of the second scan line, thereby causing duplicate exposure.

Afterwards, the current of the off beams is measured on the aperture plate 160 of the E-beam exposure apparatus 100 (S150). The current of the off beams may be measured using a sensor 165. For example, as shown in FIG. 2B, the sensor 165 may be installed on the upper surface of the aperture plate 160 adjacent to the aperture AP, and may detect the off beams incident on the sensor 165 to measure the current of the off beams.

The sensor 165 may use, for example, a CCD or a Faraday cup. However, the type of sensor 165 is not limited to the CCD or the Faraday cup. For example, all types of detectors capable of detecting incident electrons to measure a current may be used as the sensor 165. The sensor 165 may be arranged to surround the aperture AP, or may be arranged adjacent to the aperture AP to cover a certain area. The certain area may refer to an area where off beams fall.

In FIG. 1, it is shown that the measuring of the current of the off beams (S150) is performed after the performing of the exposure process (S140). However, the measuring of the current of the off beams (S150) may be included in the performing of the exposure process (S140) and may be performed in real time. However, when measuring the current for the entire exposure process on one scan line, the current may be measured after the exposure process on one scan line in the concept of obtaining a current measurement result.

The measuring of the current of the off beams (S150) may include normalizing and/or sampling the current measured through the sensor 165. Additionally, information on the off beams in the determining of the on and off beams (S120) may be needed for the normalization process. The information on the off beams may include, for example, a ratio of off beams to on beams, or information on the number of the off beams. Accordingly, as a means of transferring information on the off beams, a dashed arrow is indicated in FIG. 1 from the determining of the on and off beams (S120) to the measuring of the current (S150). Details of the calculating of the current of the off beams (S150) are described in detail in the description of FIGS. 3A to 3D.

Afterwards, it is determined whether the exposure process for a set area is completed (S160). When the exposure process is completed (YES), the E-beam exposure method according to an embodiment ends. When the exposure process is not completed (NO), it is determined whether the current is within a set reference range (S170). The set reference range may be from a first threshold value (e.g., lower control limit) to a second threshold value (e.g., upper control limit) greater than the first threshold value. Hereinafter, for convenience of explanation, the determining of whether the exposure process is completed (S160) is referred to as a first determination, the determining of whether the current is within the set reference range (S170) is referred to as a second determination.

Regarding the first determination (S160), for a specific example, when there are n scan lines for a set area, it is determined whether the scan line on which the exposure process was performed is the nth scan line in the first determination (S160), and when the scan line is the nth scan line (YES), the E-beam exposure method ends, and when the scan line is not the nth scan line (NO), the second determination (170) is performed.

In the second determination (S170), when the current is not within the reference range (NO), the determining of the exposure time (S130) is performed. Additionally, in the determining of the exposure time (S130), the exposure time is changed based on the measured current. For example, when the current is smaller than the reference range, the exposure time may be increased, and when the current is greater than the reference range, the exposure time may be decreased. The increase in the exposure time may refer to an increase in the dose amount, and the decrease in the exposure time may mean a decrease in the dose amount. When the exposure time is increased or decreased, the increased or decreased exposure time may be used as the exposure time when the performing of the exposure process (S140) is next performed.

When the current is within the reference range (YES), the performing of the exposure process (S140) may be performed to continue to perform the exposure process.

In the E-beam exposure method according to an embodiment, the current of the off beams may be measured using the sensor 165 placed on the upper surface of the aperture plate 160 adjacent to the aperture AP, and the current of the off beams may be accurately calculated through calculation processes, such as normalization and sampling processes. The current of the off beams may be the same or substantially the same as the current of the on-beams. Accordingly, the E-beam exposure method according to an embodiment may accurately measure the current of the E-beam used for patterning in the E-beam exposure process, and the resulting exposure time. Additionally, when there is an error in the exposure time, the exposure time may be appropriately corrected. Furthermore, the E-beam exposure method according to an embodiment improves the reliability of the E-beam exposure process and makes it possible to manufacture a reliable mask by measuring and correcting the exposure time in the E-beam exposure process in real time.

For reference, in general, in an E-beam exposure apparatus, when the amount of electrons emitted from an E-beam source, e.g., an electron gun, changes, an error may occur in the critical dimension (CD) of the photomask being exposed. To limit and/or prevent the error, the exposure time is compensated in real time by measuring current fluctuations in the E-beam source. However, among all the electrons emitted from the E-beam source, only the electrons in the central portion reach the mask, while the electrons in the outer portion do not reach the mask because the electrons in the outer portion are blocked and/or utilized by various systems in the electromagnetic optical system. For example, when 100% of the electrons are emitted from the E-beam source, 99% thereof are blocked and/or utilized before reaching the aperture plate, and only about 1% thereof reach the aperture plate, some of which may reach the mask and may be used for patterning. Accordingly, when the electrons affecting the mask do not change even though the current of the E-beam source changes, over-compensation or mis-compensation may occur, and when the electrons affecting the mask change even though the current of the E-beam source does not change, non-compensation may occur.

However, in the E-beam exposure method according to an embodiment, the current may be calculated by accurately measuring electrons that affect the change in CD of the mask MS, for example, electrons falling on the aperture plate 160, that is, off beams, and thus, the on-beams reaching the mask MS may be accurately calculated. Accordingly, the E-beam exposure method according to an embodiment may reduce and/or solve problems, such as over-compensation, mis-compensation, or non-compensation due to failure to accurately detect electrons reaching the mask MS, and may provide an exposure correction method with high consistency. For example, in the E-beam exposure method according to an embodiment, the current of the off beams is measured using the sensor 165 on the aperture plate 160, and the measured current is normalized by dividing the measured current by the number of off beams and sampled in seconds again, thereby accurately confirming the amount of change in the current. In addition, by correcting the exposure time by feeding back the amount of current variation to the next exposure process, the amount of electrons irradiated in the exposure process or effective E-beam in the exposure process may be kept constant.

Figure 3A:
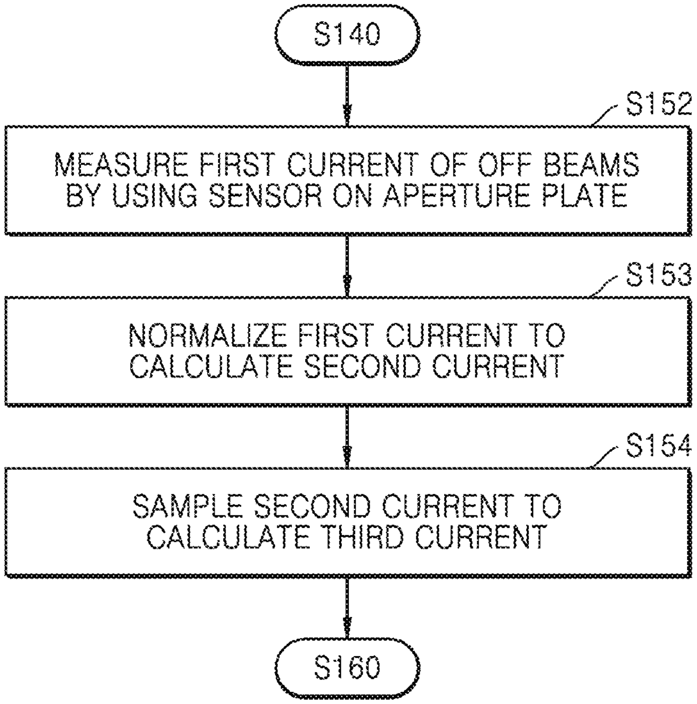
FIG. 3A is a detailed flowchart of an operation of measuring currents of off beams in the E-beam exposure method of FIG. 1, and FIGS. 3B to 3D are graphs corresponding to operations of calculating the currents of the off beams of FIG. 3A, respectively.

FIG. 3A is a detailed flowchart of an operation of measuring currents of off beams in the E-beam exposure method of FIG. 1, and FIGS. 3B to 3D are graphs corresponding to operations of calculating the currents of the off beams of FIG. 3A, respectively. The description is made with reference to FIGS. 1 to 2B, and content already described in the description of FIGS. 1 to 2B is briefly described or omitted.

Figure 3B:
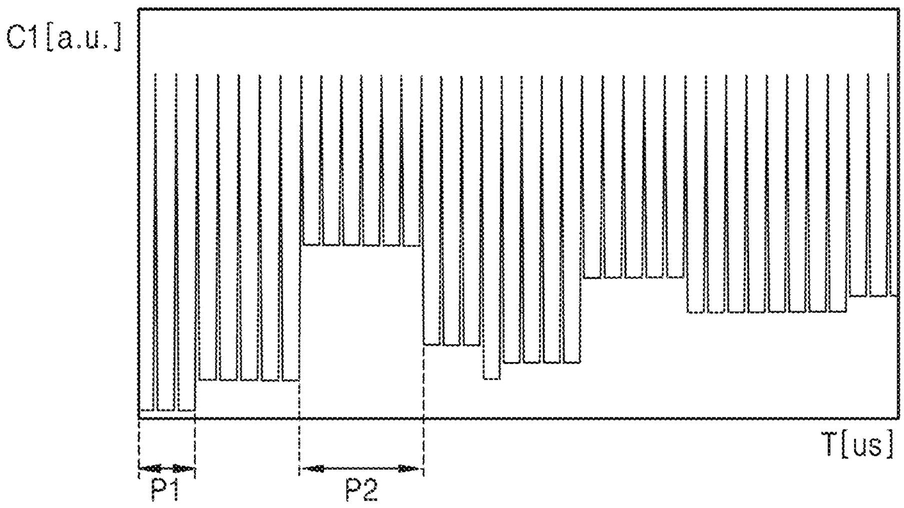

Referring to FIGS. 3A and 3B, in the E-beam exposure method, the measuring of the current of the off beams (S150) may include measuring a first current of the off beams using the sensor 165 on the aperture plate 160 (S152). As shown in FIG. 2B, the sensor 165 may be installed on the upper surface of the aperture plate 160 adjacent to the aperture AP. The sensor 165 may use, for example, a CCD or a Faraday cup. The sensor 165 may be installed to cover the entire area where off beams fall. However, in some embodiments, the sensor 165 may be installed to partially cover the area where the off beams fall. In this case, it must first be calculated what percentage of the total off beams fall on the partial area covered by the sensor 165.

The first current may be measured for one entire scan line. However, in some embodiments, the first current may be measured only for a certain section of one scan line. For example, the graph of FIG. 3B is a graph showing the result of measuring the first current for one entire scan line, where the x-axis represents the time of the entire exposure process on one scan line and the unit is microseconds, and the y-axis represents the measured first current and the unit may be an arbitrary unit.

In the E-beam exposure process, patterning may be performed by periodically repeating an off state of the E-beam. That is, in an on state of the E-beam, the E-beam may be projected onto the mask MS, and in the off state of the E-beam, the E-beam may be blocked by the aperture plate 160 and may not be projected onto the mask MS. In the graph of FIG. 3B, the position where the first current of the off beams peaks may correspond to the off state of the E-beam. For example, in the off state of the E-beam, all beamlets B-L emitted from the pattern definition system PD-S fall on the aperture plate 160 and may not pass through the aperture AP. Accordingly, in FIG. 3B, the peaks of the first current of the off beams may all have the same or substantially the same size.

When the E-beam is in the on state, the amount of the projected E-beam may vary depending on the shape of the pattern subject to exposure. For example, in the graph of FIG. 3B, the amount of E-beam projected on the mask MS is the largest in a leftmost first section P1, and therefore, the first current of the off beams may be measured to be the lowest. Additionally, in a second section P2, the amount of the E-beam projected onto the mask MS is the smallest, and therefore, the first current of the off beams may be measured to be the highest.

Figure 3C:
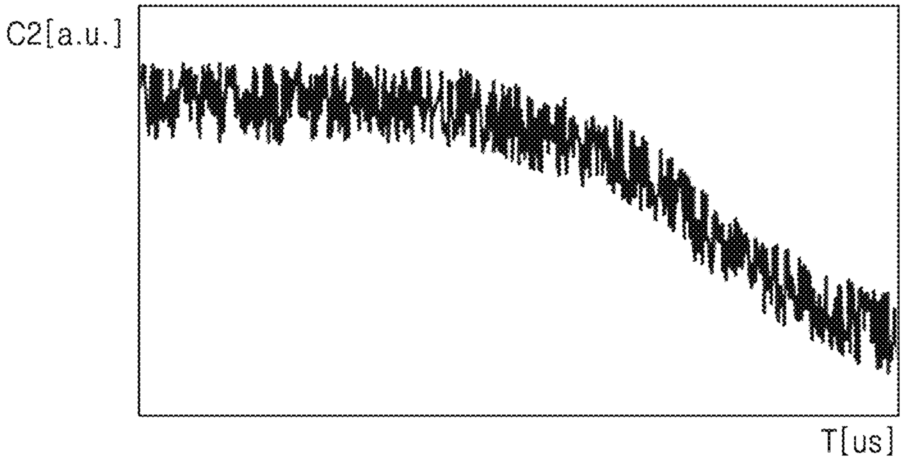

Referring to FIGS. 3A and 3C, after measuring the first current of the off beams, the first current is normalized to calculate the second current (S153). The normalization may refer to a process of calculating the current per off beam. For example, for example, when 100 off beams are incident on the sensor 165 and a current of 100 mA is measured, a current of 1 mA per off beam may be calculated by dividing 100 mA by 100. This normalization process may be performed to calculate an accurate current per off beam during the exposure process. In other words, the amount of change in current during the exposure process may be confirmed by calculating the current per off beam during the exposure process.

For reference, as shown in the graph of FIG. 3B, in the exposure process performed using a scanning method, the amount of off beams incident on the sensor 165 may vary with time based on the shape of the pattern subject to exposure. Therefore, it may be difficult to confirm the change in current during the exposure process through the measured first current. However, as shown in the graph of FIG. 3C, by calculating the current per off beam through normalization, the change in current during the exposure process may be clearly confirmed. In the graph of FIG. 3C, the x-axis represents the time of the exposure process for an entire scan line and the unit is microseconds, and the y-axis represents the calculated second current and the unit may be an arbitrary unit.

The change in the current during the exposure process may be roughly confirmed using the second current. However, as the second current is calculated in microseconds based on the first current, the second current may include a lot of noise, and such noise may cause errors in determining the change in the current. For example, as shown in FIG. 3C, the second current may be obtained in the form of numerous fluctuations due to noise. Therefore, the following sampling process may be performed to clearly determine the change in the current.

Figure 3D:
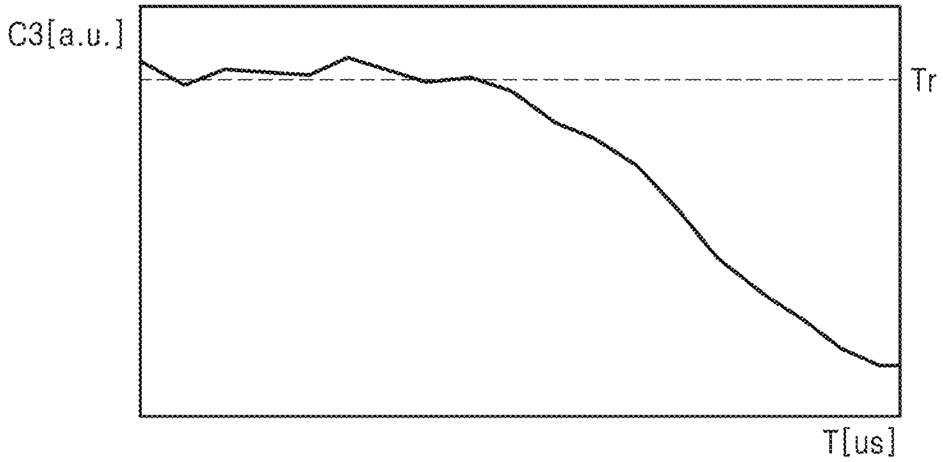

Referring to FIGS. 3A and 3D, after calculating the second current through normalization, the third current is calculated by sampling the second current (S154). For example, the third current may be calculated by averaging and sampling the second current in microseconds in seconds. As shown in the graph in FIG. 3D, the change in the third current during the exposure process may be clearly seen. In the graph of FIG. 3D, the x-axis represents the time of the exposure process for an entire scan line and the unit is microseconds, and the y-axis represents the calculated third current and the unit may be an arbitrary unit.

After calculating the third current, the current in the first determination (S160) may correspond to the third current. A desired and/or alternatively predetermined range may be set as a reference range based on a reference current Tr indicated by a dashed line in FIG. 3D. The set reference range may be from a first threshold value (e.g., lower control limit) to a second threshold value (e.g., upper control limit) greater than the first threshold value, based on differences from a target value. For example, a range of ±10% based on the reference current Tr may be set as the reference range. However, example embodiments are not limited thereto and the method of setting the reference range is not limited to the values and contents described above. In FIG. 3D, the third current is not within the reference range in a latter section of the exposure process. For example, in the latter section, the third current is lower than the reference range and therefore it is necessary to increase the third current. Therefore, in the determining of the exposure time (S130), the dose amount may be increased by increasing the exposure time. Although not shown, in the opposite case, the dose amount may be reduced by reducing the exposure time.

In the E-beam exposure method according to an embodiment, the current of the off beams may be calculated in real time in the E-beam exposure process, and the corresponding exposure time may be changed in real time during the exposure process. For example, in the E-beam exposure process, the current of the off beams, that is, the third current, is calculated in units of scans, and the third current is converted into the exposure time, which may be fed back and immediately reflected in the exposure process of the next scan line. That is, in the E-beam exposure process of the current scan line, when the third current is not within the reference range, the third current may be converted into the exposure time, and the exposure process may be performed by increasing or decreasing the exposure time in the E-beam exposure process of the next scan line.

Figure 4:
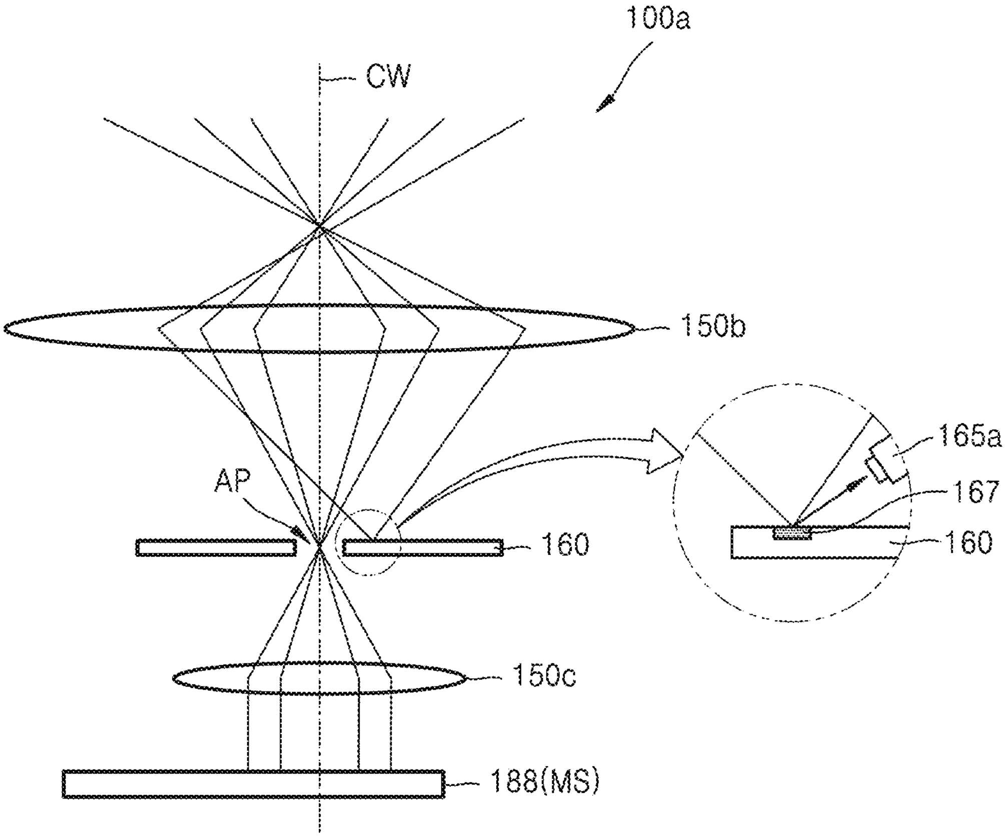
FIG. 4 is a conceptual diagram of an E-beam exposure apparatus used in an E-beam exposure method according to an embodiment.

FIG. 4 is a conceptual diagram of an E-beam exposure apparatus used in the E-beam exposure method according to an embodiment, and corresponds to an enlarged view of FIG. 3B. The description is made with reference to FIGS. 1 and 2A, and content already described in the description of FIGS. 1 to 3D is briefly described or omitted.

Referring to FIG. 4, in the E-beam exposure method according to an embodiment, an E-beam exposure apparatus 100*a* may use a marker 167 and a sensor 165*a* to measure a current of the off-beams in an aperture plate 160. That is, in the E-beam exposure method according to an embodiment, electrons reflected or scattered from the marker 167 may be detected using the sensor 165*a*, and the current of the off beams may be measured. Additionally, in the E-beam exposure method according to an embodiment, normalization and sampling processes may be performed after measuring the current of the off-beams using the marker 167 and the sensor 165*a*.

The marker 167 may be placed on the upper surface of the aperture plate 160 adjacent to the aperture AP. The marker 167 may include, for example, a grid or a mirror. The marker 167 may be installed to cover the entire area where off beams fall. The sensor 165*a* may include, for example, a CCD or a Faraday cup. However, the type of sensor 165*a* is not limited thereto.

Figure 5:
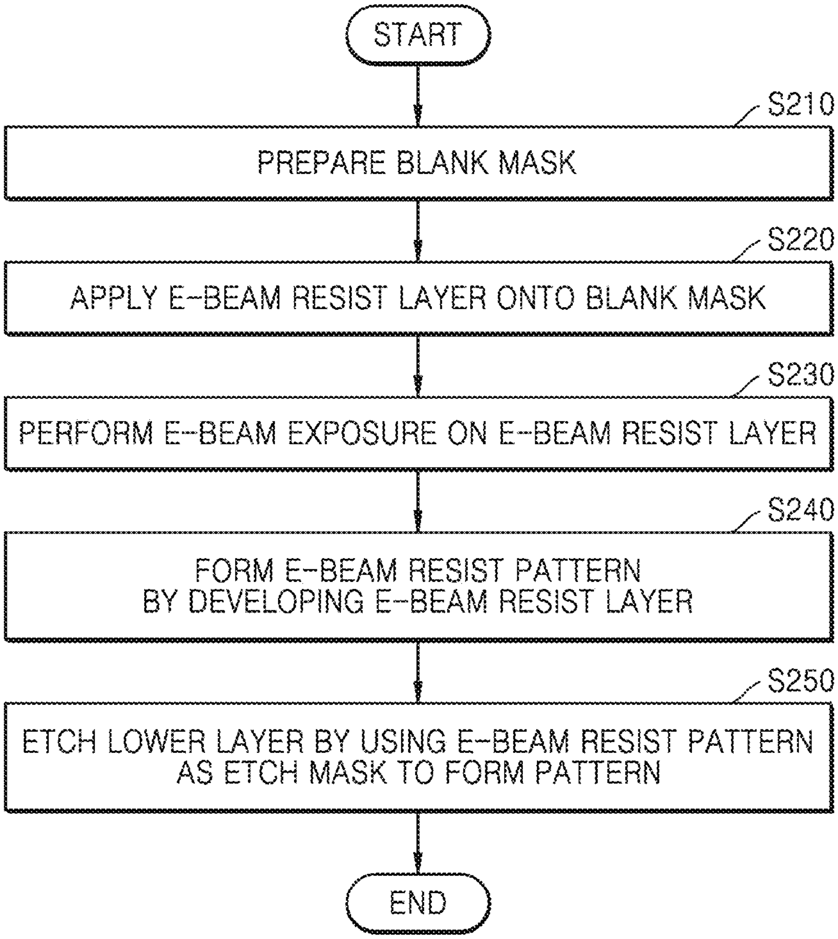
FIG. 5 is a schematic flowchart of a mask manufacturing method including an E-beam exposure method according to an embodiment.

FIG. 5 is a schematic flowchart of a mask manufacturing method including an E-beam exposure method according to an embodiment. The description is made with reference to FIGS. 1 to 2B, and content already described in the description of FIGS. 1 to 4 is briefly described or omitted.

Referring to FIG. 5, in the mask manufacturing method including the E-beam exposure method according to this embodiment (hereinafter simply referred to as the "mask manufacturing method"), a blank mask is first prepared (S210). The blank mask may refer to a mask before a pattern is formed. The mask may be largely divided into a transmissive mask and a reflective mask. In the transmissive mask, exposure light may pass through the mask and may be projected onto a wafer subject to exposure. On the other hand, in the reflective mask, exposure light may be reflected from the mask and may be projected onto the wafer subject to exposure.

The transmissive mask may include a general photomask. The photomask may have a structure in which an opaque light blocking layer is placed on a transparent substrate. The transparent substrate may include a low thermal expansion material (LTEM). In other words, the transparent substrate may include a material with a low coefficient of thermal expansion (CTE). For example, the transparent substrate may include glass, silicon (Si), quartz, etc. The light blocking layer may include, for example, chrome. However, the material of the light blocking layer is not limited to chrome.

In the blank photomask, a series of processes, such as an E-beam exposure process, a development process, and an etching process described below, may be performed to form a pattern on the light blocking layer. When a pattern is formed on the light blocking layer, the exposure light may pass through an open area of the pattern and may be projected onto the wafer subject to exposure. Accordingly, the pattern transferred on the wafer may correspond to the shape of the open area of the pattern of the light blocking layer. However, depending on characteristics of photoresists on the wafer, the transferred pattern may be reversed.

The reflective mask may typically include an EUV mask. The EUV mask may include a substrate, a reflective multilayer, a capping layer, and an absorbent layer. The substrate may include an LTEM material, e.g., a low CTE material. For example, the substrate may include glass, Si, quartz, and the like.

The reflective multilayer may be placed on the substrate. The reflective multilayer may reflect light incident on the reflective multilayer, for example, EUV ray. The reflective multilayer may include a Bragg reflector. For example, the reflective multilayer may have a multilayer structure in which two material layers are alternately stacked in tens of layers. For example, about 40 to 60 first material layers with a low refractive index and about 40 to 60 second material layers with a high refractive index may be stacked in the reflective multilayer. The first material layer may include molybdenum (Mo), and the second material layer may include Si. However, the materials of the first material layer and the second material layer are not limited to the materials described above.

The capping layer may be placed on the reflective multilayer. The capping layer may limit and/or prevent damage to the reflective multilayer and surface oxidation thereof. The capping layer may include, for example, ruthenium (Ru). However, the material of the capping layer is not limited to Ru. The capping layer may be optional. Accordingly, in some embodiments, the capping layer may be omitted.

The absorbent layer may be placed on the capping layer. When the capping layer is omitted, the absorbent layer may be placed on the reflective multilayer, for example, the second material layer. The absorbent layer may include a material that absorbs incident light, such as EUV ray. Therefore, EUV ray incident on the absorbent layer may not reach the reflective multilayer. The absorbent layer may include, for example, TaN, TaHf, TaHfN, TaBSi, TaBSiN, TaB, TaBN, TaSi, TaSiN, TaGe, TaGeN, TaZr, TaZrN, or combinations thereof. However, the absorbent material is not limited to the above-mentioned materials.

In the blank EUV mask, a series of processes, such as an E-beam exposure process, a development process, and an etching process described below, may be performed to form a pattern on the absorbent layer. When a pattern is formed on the absorbent layer, the EUV ray may reach the reflective multilayer through the open area of the pattern, may be reflected from the reflective multilayer, and may be projected onto the wafer subject to exposure. Accordingly, the pattern transferred on the wafer may correspond to the shape of the open area of the pattern of the absorbent layer.

After preparing the blank mask, an E-beam resist layer is applied onto the blank mask (S220). For example, when the blank mask is a photomask, the E-beam resist layer may be applied onto the light blocking layer. Additionally, when the blank mask is an EUV mask, the E-beam resist layer may be applied onto the absorbent layer.

After applying the E-beam resist layer, the E-beam exposure process is performed on the E-beam resist layer (S230). In the mask manufacturing method according to an embodiment, the E-beam exposure process may be performed through the E-beam exposure method of FIG. 1. Accordingly, the E-beam exposure process may be performed on a set area by sequentially performing operations of receiving the information on the pattern (S110), determining the on and off beams (S120), determining the exposure time (S130), performing the exposure process (S140), measuring the current of the off beams (S150), the first determination (S160), and the second determination (S170).

After performing the E-beam exposure process, an E-beam resist pattern is formed by developing the E-beam resist layer (S240). The forming of the E-beam resist pattern (S240) may further include a cleaning process, a bake process, etc., as well as a development process on the E-beam resist layer.

After forming the E-beam resist pattern, a lower layer is etched using the E-beam resist pattern as an etching mask to form a pattern (S250). For example, in the case of the photomask, the light blocking layer may be etched using the E-beam resist pattern as an etching mask to form a pattern on the light blocking layer. Additionally, in the case of the EUV mask, the absorbent layer may be etched using the E-beam resist pattern as an etch mask to form a pattern on the absorbent layer.

After forming the pattern, a series of processes are performed to complete the mask. The series of processes may include, for example, development, etching, and cleaning. Additionally, the series of processes may include a measurement process, and a defect inspection or defect repair process. Furthermore, the series of processes may include a pellicle application process. The pellicle application process may refer to a process of attaching a pellicle to a mask surface to protect the mask from subsequent contamination during delivery of the mask and during the lifespan of the mask, once it is confirmed through final cleaning and inspection that there are no contaminant particles or chemical stains.

The mask manufacturing method according to an embodiment may be performed through the E-beam exposure method of FIG. 1 in the E-beam exposure process. Accordingly, in the E-beam exposure process, the current of the E-beam used for patterning and, accordingly, the exposure time may be accurately measured, and the exposure time may also be appropriately corrected when there is an error in the exposure time. In addition, the mask manufacturing method according to an embodiment improves the reliability of the E-beam exposure process and makes it possible to manufacture a reliable mask by measuring and correcting the exposure time in the E-beam exposure process in real time.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts has been particularly shown and described with reference to embodiments thereof, it will be understood that various changes in form and details may be made therein without departing from the spirit and scope of the following claims.

What is claimed is:

1. An E-beam exposure method comprising:

receiving exposure information on a pattern subject to exposure;

determining on beams and off beams of an E-beam exposure apparatus;

determining an exposure time in an exposure process;

performing the exposure process using the E-beam exposure apparatus;

measuring a current of the off beams on an aperture plate of the E-beam exposure apparatus; and a first determination of determining whether the current is within a reference range, wherein in response to the current not being within the reference range in the first determination, the determining the exposure time is performed and the exposure time is changed.

2. The E-beam exposure method of claim 1, wherein the on beams are beams that pass through an aperture of the aperture plate and reach a mask, the off beams are beams that are blocked by the aperture plate and do not reach the mask, and in the measuring the current of the off beams, the current of the off beams is measured using a sensor.

3. The E-beam exposure method of claim 2, wherein the sensor is on an upper surface of the aperture plate adjacent to the aperture.

4. The E-beam exposure method of claim 2, wherein the E-beam exposure apparatus is a multi-beam mask writer (MBWM), the performing the exposure process includes generating and emitting an E-beam from an E-beam source and dividing the E-beam into multiple beamlets using an aperture plate system (APS) such that the multiple beamlets passing through the APS move to the aperture plate, and according to a voltage applied from the APS, the multiple beamlets are tilted to divide the multiple beamlets between the on beams and the off beams.

5. The E-beam exposure method of claim 1, wherein the measuring the current of the off beams comprises:

measuring a first current of the off beams using a sensor on the aperture plate, calculating a second current by normalizing the first current, and calculating a third current by sampling the second current.

6. The E-beam exposure method of claim 5, wherein in the calculating the second current, the first current is normalized by dividing the first current by a number of the off beams.

7. The E-beam exposure method of claim 5, wherein in the calculating the third current, the first current in microseconds is averaged and sampled in seconds, and the third current is used in the first determination.

8. The E-beam exposure method of claim 1, wherein if current is lower than the reference range in the first determination, the exposure time is increased, and if the current is higher than the reference range in the in first determination, the exposure time is reduced.

9. The E-beam exposure method of claim 1, wherein in response to the current not being within the reference range in the first determination, the exposure time is changed in real time during the exposure process.

10. The E-beam exposure method of claim 1, wherein in the measuring of the current of the off beams, the current of the off beams is measured by detecting electrons reflected or scattered from a marker on the aperture plate.

11. The E-beam exposure method of claim 1, further comprising:

before the first determination, a second determination of determining whether the exposure process for a set area is completed, wherein if the exposure process is not completed in the second determination, the first determination is performed, and if the current is within the reference range in the first determination, the exposure process is performed.

12. An E-beam exposure method comprising:

receiving information on a pattern subject to exposure;

determining on beams and off beams of an E-beam exposure apparatus;

determining an exposure time in an exposure process;

performing the exposure process using the E-beam exposure apparatus;

measuring a first current of the off beams using a sensor on an aperture plate of the E-beam exposure apparatus;

calculating a second current by normalizing the first current;

calculating a third current by sampling the second current;

a first determination of determining whether the exposure process for a set area is completed; and in response to determining the exposure process is not completed in the first determination, performing a second determination of determining whether the third current is within a reference range, wherein in response to the third current not being within the reference range in the second determination, the determining the exposure time is performed and the exposure time is changed, and in response to the third current being within the reference range in the second determination, the exposure process is performed without changing the exposure time.

13. The E-beam exposure method of claim 12, wherein in the calculating the second current, the first current is normalized by dividing the first current by a number of the off beams, and in the calculating the third current, the second current in microseconds is averaged and sampled in seconds.

14. The E-beam exposure method of claim 12, wherein if the third current is lower than the reference range in the second determination, the exposure time is increased, and if the third current is higher than the reference range in the second determination, the exposure time is reduced.

15. The E-beam exposure method of claim 12, wherein in response to the third current not being within the reference range in the second determination, the exposure time is changed in real time during the exposure process.

16. A mask manufacturing method comprising:

preparing a blank mask;

applying an E-beam resist layer onto the blank mask;

performing an E-beam exposure process on the E-beam resist layer;

developing the E-beam resist layer to form an E-beam resist pattern; and etching a lower layer by using the E-beam resist pattern as an etch mask, wherein the performing of the E-beam exposure process includes receiving exposure information on a pattern subject to exposure, determining on beams and off beams of an E-beam exposure apparatus, determining an exposure time in an exposure process, performing the exposure process using the E-beam exposure apparatus, measuring a current of the off beams on an aperture plate of the E-beam exposure apparatus, and a first determination of determining whether the current is within a reference range, and in response to the current not being within the reference range in the first determination, the determining the exposure time is performed and the exposure time is changed.

17. The mask manufacturing method of claim 16, wherein the on beams are beams that pass through an aperture of the aperture plate and reach a mask, the off beams are beams that are blocked by the aperture plate and do not reach the mask, and a sensor on an upper surface of the aperture plate adjacent to the aperture is used in the measuring the current of the off beams.

18. The mask manufacturing method of claim 16, wherein the measuring the current of the off beams comprises:

measuring a first current of the off beams by using a sensor on the aperture plate;

normalizing the first current to calculate a second current; and sampling the second current to calculate a third current.

19. The mask manufacturing method of claim 18, wherein in the calculating of the second current, the first current is normalized by dividing the first current by a number of the off beams, in the calculating of the third current, the second current in microseconds is averaged and sampled in seconds, and in response to the current not being within the reference range in the first determination the exposure time is changed in real time during the exposure process.

20. The mask manufacturing method of claim 16, further comprising:

before the first determination, a second determination of determining whether the exposure process for a set area is completed, wherein if the exposure process is not completed in the second determination, the first determination is performed, and if the current is within the reference range in the first determination, the exposure process is performed.

* * * * *